United States Patent Office 3,342,593
Patented Sept. 19, 1967

3,342,593

PHOTOPOLYMERIZATION PROCESS

Marion Burg, Metuchen, N.J., assignor to E. I. du Pont de Nemours and Company, Wilmington, Del., a corporation of Delaware No Drawing. Filed Sept. 24, 1963, Ser. No. 311,229
12 Claims. (Cl. 96—28)

This invention relates to an image production process and more particularly to a process for transferring images from photopolymerized image-bearing elements to a new receptor surface. Still more particularly, it relates to a dry thermal process for so transferring such images.

Various processes for producing copies of an image embodying thermal transfer are known. A useful process for forming images by dry addition photopolymerization reactions is disclosed in Burg and Cohen, U.S. Patent 3,060,023. An improvement over this process was disclosed in Heiart U.S. Patent 3,060,026 wherein the effect of oxygen inhibition of photopolymerization was overcome by exposing through a laminated, strippable, transparent cover sheet. Another process for overcoming the effect of oxygen inhibition is disclosed in assignee's Burg U.S. application Ser. No. 234,214 filed Oct. 30, 1962, now Patent No. 3,203,805 which discloses the use of a wax cover stratum over the photopolymerizable stratum, the cover stratum being thermally transferable along with underexposed image areas.

It is an object of this invention to provide a novel thermal process for obtaining sharp image distinctions in an exposed element containing a photopolymerizable polymer. A further object of this invention is to provide a novel thermal process for transferring an image from an element bearing a photopolymerized image. Another object is to provide a thermal process for this transfer which is simple and dependable. A more specific object is to provide a process for reproduction of images to give low stain and high contrast. A still further object is to provide a process for thermal transfer of an image which eliminates the necessity of excluding oxygen during the exposure step. Still further objects will be apparent from the following description of the invention.

The above objects are accomplished in accordance with the present invention which constitutes a process for image production from a photopolymerizable element which comprises:

(A) Exposing until polymerization occurs, photopolymerizable element with actinic radiation, imagewise and under atmospheric conditions, said photopolymerizable element having a support bearing a photopolymerizable stratum which is solid below 40° C. and thermally transferable by having a stick temperature above 40° C. and below 220° C., said stratum comprising, (1) an addition polymerizable non-gaseous, ethylenically unsaturated compound containing at least one terminal ethylenic group ($CH_2{=}C{<}$), having a boiling point above 100° C. at normal atmospheric pressure and being capable of forming a high polymer by free-radical initiated, chain-propagating addition polymerization, and (2) from 0.001 to 10 or more parts per hundred parts by weight of component (1) of a free-radical generating polymerization initiator-system activatable by actinic radiation, the polymerization resulting in an increase in stick temperature of the photopolymerizable stratum within the stratum underlying the surface of the exposed image areas with substantially less polymerization and less increase in stick temperature within the stratum underlying the surface of the underexposed, complementary, adjoining, coplanar image areas, and (B) Momentarily pre-heating the exposed element to a temperature above 35° C. but below the stick temperature of the underexposed areas, the process being further characterized in that the exposure step (A) must be sufficient that, after the heating step (B) there must be provided a difference of at least 10° C. in the stick temperatures of said exposed and underexposed areas.

It is preferred to transfer said pre-heated image corresponding to the unexposed image areas by bringing the surface of the exposed element into operative contact with the surface of an image-receptive support while simultaneously heating at an operating temperature intermediate between the stick temperatures of said exposed and underexposed image areas, and then separating the two surfaces at a temperature intermediate between the two said stick temperatures.

Exposing "under atmospheric conditions" means exposing in such a manner that oxygen from the atmosphere is continuously in contact with the surface of the element. Exposure, therefore, does not require strippable or transferable cover sheets, vacuum printing frames, etc. Relatively high intensity of exposure is required, however, as compared with processes in which oxygen is excluded during exposure.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature" as applied to either an underexposed or exposed area of a photopolymerizable stratum, means the minimum temperature at which the image area in question sticks or adheres (transfers), within five seconds, under slight pressure, e.g., thumb pressure, to analytical paper (Schleicher Schull analytical filter paper #595) and remains adhered in a layer of at least detectable thickness after separation of the analytical paper from the stratum. The term "operating temperature" means the temperature at which the operation of transferring the image from the photopolymerizable stratum to the image-receptive surface is actually carried out. The operating temperature is between the stick temperatures (as just defined) of the underexposed and the exposed areas of a photopolymerizable stratum.

The preferred photopolymerizable strata useful in the process of this invenion in addition may contain (3) a viscosity modifying agent, preferably a thermoplastic compound which is solid at 50° C. Such agents include filler materials, both inorganic and organic, plasticizers and high-boiling solvents. Constituents (1) and (3) can be present in amounts from 3 to 97 and 97 to 3 parts by weight, respectively. Particularly preferred photopolymerizable strata may also contain (4) a thermal addition polymerization inhibitor in an amount from 0.001 to 5 parts by weight per 100 parts by weight of the other components of the composition, and (5) from 0.001 to 3.0 parts by weight per one hundred parts by weight of constituent (1) of a sensitometric modifier, e.g., an N substituted p-nitrosoaniline modifier as disclosed in assignee's Heiart application Ser. No. 186,221, filed April 9, 1962, now Patent No. 3,203,801 or an imine oxide modifier as disclosed in assignee's Burg application Ser. No. 186,222, filed April 9, 1962, now Patent No. 3,203,802. Various dyes, pigments, thermographic compounds and color-forming components can be added to the photopolymerizable compositions to give varied results after the transfer. These additive materials, preferably, should not absorb excessive amounts of radiation at the exposure wave length or inhibit the polymerization reaction. Materials which are useful in this manner are disclosed in assignee's Burg application Ser. No. 188,222, filed April 9, 1962.

Suitable free-radical initiated, chain-propagating addition polymerizable ethylenically unsaturated compounds for use in this invention are disclosed in assignee's Heiart application Ser. No. 186,221, filed April 9, 1962. Other suitable polymerizable compounds are the pentaerythritol esters disclosed in assignee's Celeste and Seide application Ser. No. 274,909, filed Apr. 23, 1963, now Patent No. 3,261,686. Some of these disclosed polymerizable compounds are normally solid and non-tacky at operating temperatures. However, these monomers can be used according to this invention when they are present in combination with plasticizers or high-boiling solvents so that they become pressure-transferable. Suitable plasticizers include low molecular weight polyethylene oxides, glycerol, phthalate esters such as dibutyl phthalate, and the like.

The ethylenic unsaturation can be present as an extralinear substituent attached to the polymer, such as polyvinylacetate/acrylate, cellulose acetate/acrylate, cellulose acetate/methacrylate, N-acrylyloxymethylpolyamide, N-methacrylyloxymethylpolyamide, etc., in which case the monomer and polymer functions are combined in a single material.

Assignee's Heiart application Ser. No. 186,221, filed Apr. 9, 1962, also discloses compounds suitable as free-radical generating addition polymerization photoinitiators which are activatable by actinic radiation, compounds suitable as viscosity modifying agents, especially the thermoplastic compounds, and suitable compounds which inhibit thermal polymerization.

To the photopolymerizable composition there can also be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamine-formaldehyde resins, etc. If desired, the photopolymerizable layers can also contain immiscible polymeric or non-polymeric organic or inorganic fillers or reinforcing agents which are essentially transparent at the wavelengths used for exposure of the photopolymeric material, e.g., the organophilic silicas, bentonites, silica, powdered glass, colloidal silver as well as various types of dyes and other colorants. Such materials are used in amounts varying with the desired properties of the photopolymerizable layer. Fillers are useful in improving the strength of the composition, reducing tack and in addition, as coloring agents.

The photopolymerizable composition is preferably coated on a base support. Suitable support materials are disclosed in assignee's Heiart application Ser. No. 186,221, filed Apr. 9, 1962. The support may have in or on its surface and beneath the photopolymerizable stratum an antihalation layer as disclosed in the above reference or other substrata needed to facilitate anchorage to the base.

Step (A) of the process of this invention comprises exposing the photopolymerizable stratum to actinic radiation. Preferably, the exposure is by reflex exposure techniques. By using this type of exposure, right-reading copies can be made from materials having messages on both sides of the page or from opaque supports, e.g., paper, cardboard, metal etc., as well as from poor light-transmitting surfaces. Alternately, the exposure may be effected by transmitted light through a two-tone, half-tone, or continuous tone image or transparency. The image or transparency may or may not be in operative contact with the transferable layer, e.g., contact exposure or projection exposure can be made. It is possible to expose through paper or other light-transmitting materials. A stronger radiation source or longer exposure times must be used, however.

Since the preferred free-radical generating addition-polymerization initiators activatable by actinic radiation, e.g., 9,10-phenanthrenequinone, exhibit at least part of their sensitivity in the visible range, the radiation source should furnish an effective amount of this radiation. Such sources include carbon arcs, mercury-vapor arms, fluorescent lamps, argon glow lamps, electronic flash units and photographic flood lamps. Since this invention requires the absence of an oxygen-barrier layer, the more intense radiation sources are preferred in order to overcome the chain-terminating effect of the oxygen.

The particular point of novelty in this invention, over the disclosures of other patents and applications of the assignee, resides in step (B) wherein the exposed element is momentarily heated so as to permit unpolymerized ethylenically unsaturated material in the surface of the exposed area to diffuse away from the surface. The effect of oxygen inhibition is particularly severe at the surface of the unprotected photopolymerizable stratum. There is some inhibition in the interior of the stratum but, as exposure continues, oxygen is consumed in the interior of the stratum so that, after a brief induction period, the polymerization reaction is able to proceed. At the surface, however, oxygen is being constantly replenished so that very little polymerization is able to occur. Thus, it appears fairly evident that, immediately after the exposure, there will be relatively little difference in the degree of polymerization in the exposed and in the underexposed areas at the surface. Likewise, it is a reasonable assumption that there will be a considerably greater difference between the exposed and the underexposed areas in the degree of polymerization in the interior of the stratum. Accordingly, it has been found that a very substantial improvement in the quality of the transferred image can be effected by the addition of step (B), the pre-heating step. In this pre-heating step it is important that sufficient heat be supplied to permit plasticizer and/or unpolymerized monomer to diffuse away from the surface. At the same time, it is desirable that this heating should not be sufficient to cause extensive lateral diffusion of the image which would cause, in turn, a lack of sharpness in the transferred image. The heating, therefore, must be optimized within these limitations. With suitable heating in this step (as compared with a procedure wherein the pre-heating step is omitted), it is possible to magnify greatly the contrast of the transferred image and to reduce substantially (almost eliminate) the stain caused by transfer of unpolymerized, dye-containing surface material from the exposed areas of the photopolymerizable stratum. The element must be momentarily heated to some temperature above 35° C. but below the stick temperature of the underexposed areas. Obviously, the time and temperature of this heating step are interrelated so that a shorter period of heating time is required at a relatively high temperature and vice versa. It is required that the temperature and heating time be such that the photopolymerizable stratum does not reach a temperature as high as the stick temperature of the underexposed area. Heat can be applied by means well known to the art, e.g., rollers, flat or curved heating surfaces or platens, radiant sources, e.g., heating lamps, etc. Preferably, the period of pre-heating time is about 0.01 to three seconds.

A useful process has been completed at this stage since there is now a sharp imagewise differentiation between underexposed and exposed areas both at the surface and within the interior of the photopolymerizable stratum, i.e., a useful "latent" image has been formed. This "latent" image has utility in the formation of other images by the thermal transfer means or it may be used in processes involving dusting or stripping techniques as disclosed in Burg and Cohen, U.S. 3,060,024 and U.S. 3,060,025, respectively.

In the preferred aspect of this invention involving thermal transfer (image reproduction) the photopolymerizable stratum containing the "latent" image (formed by exposure plus pre-heating) is placed in contact with the receptor support and the stratum is heated to the operating temperature to effect the transfer of the underexposed areas of the photopolymerizable composition. Again, heat can be applied by means well known to the art, e.g., rollers, flat or curved heating surfaces or platens, radiant sources, such as heating lamps, etc. The heating temperatures required to carry out the thermal transfer operation is defined as an "operating" temperature which is intermediate between the stick temperature of the exposed and underexposed image areas. The contact time should be about 0.1 to 10 seconds, with the preferred contact time being near the lower time limit. Shorter periods of contact are possible by using an intense radiant source of heat, e.g., infrared lamps. Sufficient pressure should be applied to maintain adequate operative contact between the two surfaces. The pressure can be supplied conveniently by pressing the superimposed elements through pressure rollers.

The "operating" temperature and the pre-heating temperature is governed by the stick temperatures of the exposed and unexposed photopolymerizable polymer. These stick temperatures for a particular photopolymer are easily determined empirically by one skilled in the art.

The image-receptive support to which the image is transferred must be stable at the operating temperature. The particular support used is determined from the desired use for the transferred image and on the adhesion of the image to the base. Suitable image-receptive supports are disclosed in assignee's Heiart application Ser. No. 186,221, filed Apr. 9, 1962. The image-receptive support may have a hydrophilic surface or may contain on its surface chemical compounds which react with compounds being transferred so as to produce differences in color, hydrophilicity or conductivity between the exposed and the underexposed areas or for improved adhesion to, or brightening of, the receptive support. The image-receptive surface may be smooth, contain roughening agents such as silica, be perforated or be in the form of a mesh or screen.

The invention will be further illustrated by, but is not intended to be limited to, the following detailed examples wherein the abbreviation CI refers to the Colour Index, second edition 1956, The Society of Dyers and Colourists, Dean House, Picadilly, Bradford, Yorkshire, England, and the American Association of Textile Chemists and Colorists, Lowell Technological Institute, Lowell, Mass., U.S.A.

EXAMPLE I

A photopolymerizable composition was prepared from:

10.4 g. cellulose acetate butyrate (containing about 26% butyryl, 20.5% acetyl and 2.5% hydroxyl groups and having a viscosity of 9.0–13.5 poises determined by A.S.T.M. Method D–871–54T in solution described as Formula A in this method)
10.4 g. of polyethylene glycol diacrylate derived from the precursor glycol having an average molecular weight of 300
0.21 g. phenanthrenequinone, initiator
0.35 g. anthraquinone Blue 2 GA Dye (CI Acid Blue 58)
8.4 mg. N,N-diethyl-p-nitrosoaniline, sensitometric modifier, and
59 g. acetone and was coated on a 0.001 inch-thick polyethylene terephthalate film support. After drying in the dark, a 0.0004 inch-thick coating was formed. The coating was contacted with a white paper upon which was printed a black message and was exposed reflectographically through the support for two seconds to a 500-watt photoflood lamp set at a distance of 1.5 inches. After exposing, the support was very briefly heated by being drawn over a roller preheated to 113° C. (so that each individual area of the support was in contact with the roller for about 0.05 second) followed by placing the photopolymerizable stratum in contact with a paper receptor sheet and passing the superimposed elements through a pair of rollers, one of which had been brought up to a temperature of 113° C. The two sheets were separated immediately upon exiting. A duration of preheating time was used which was sufficiently brief that the photopolymerizable stratum itself did not reach the temperature of the heated roller, but it is estimated the stratum temperature did not exceed 90° C. during the preheating (well below the stick temperature of the underexposed photopolymerizable stratum). During the subsequent thermal transfer step wherein contact time between the heated roller and the stratum was significantly longer (about 0.3 second), the temperature of photopolymerizable stratum approached closely the temperature (113° C.) of the heated roll itself. A high-contrast blue copy of the original black message was obtained on the paper support. Using the same light intensity and keeping transfer conditions unchanged, similar results were obtained by exposing for four, eight, fifteen and thirty seconds.

When the above example was repeated, except for omission of the preheating step, a low-contrast copy was obtained having a high level of stain.

EXAMPLE II

Similar results were obtained using the formulation like that of Example I but which contained only one-half the sensitometric modifier concentration. The composition was coated as in Example I to give a resultant dry coating thickness of about 0.0003 inch. Reflectographic exposure, preheating and subsequent thermal transfer of the underexposed message areas to the paper receptor, using identical conditions described for Example I, afforded similar blue copies of the original over an exposure time range of from four to fifteen seconds. By changing the distance between the light source and the sample to one inch and 2.5 inches, similar copies were obtained for exposures over ranges of two to fifteen and five to fifteen seconds, respectively.

The use of the sensitometric modifier in this example yielded superior copies.

EXAMPLE III

A 0.0005 inch-thick coating similar to the one described for Example I was prepared from

| | | |
|---|---|---|
| Cellulose acetate butyrate (as described in Example I) | g. | 10.4 |
| Triethylene glycol diacrylate | g. | 10.4 |
| Phenanthrenequinone | g. | 0.21 |
| Anthraquinone Blue 2 GA Dye (CI Acid Blue 58) | g. | 0.03 |
| N,N-dimethyl-p-nitrosoaniline | mg. | 4.2 |
| Acetone | g. | 59 |

Exposure conditions were used which were similar to those described for Example I, with the light source at a distance of two inches from the test sample, and exposure times being from 5 to 15 seconds. The element was preheated by very briefly passing the support over a roller which had been heated to 120° C. (the time of contact with the roller being less than 0.1 second so that the element temperature did not reach that of the roller). Subsequently, the photopolymerizable stratum was placed in contact with a sheet of receptor paper and the superposed elements were passed through a pair of heated rollers. With thermal transfer at an operating temperature of 120° C. blue copies of the original copy were obtained. Image quality was improved using twice the concentration of sensitometric modifier and became progressively poorer at lower concentrations.

EXAMPLE IV

A photopolymerizable composition was prepared comprising 8.65 pentaerythritol triacrylate
2.16 g. cellulose acetate butyrate containing about 20.5% acetyl groups and about 26% butyryl groups and having a viscosity of 56 to 131 poises as determined by A.S.T.M. Method D-871-54T in solution described as Formula A in this method
0.84 g. cellulose acetate having 39% acetyl groups and an A.S.T.M. viscosity of 45 poises
0.096 g. phenanthrenequinone
8.4 g. methyl Cellosolve and
4.4 g. of dye solution prepared from 30 g. methyl Cellosolve and 1.2 g. Pontacyl Wool Blue BL (CI Acid Blue 59)

and brought up to total weight of 100 g. with methylene chloride.

The composition was coated to a dry thickness of 0.0004 inch and samples were exposed reflectographically at a distance of 2 inches from the light source for 7 seconds and for 14 seconds, followed by preheating and transferring all according to procedures similar to those described in Example I. Preheating raised the temperature of the photopolymerizable stratum to about 100° C. while the thermal transfer was carried out at an operating temperature of 120° C. Good legible copies of the original message were obtained, although background stain was greater than in the earlier examples wherein a sensitometric modifier was present in the photopolymerizable stratum.

Another sample of the coating was exposed by transmission whereby the exposing radiation first passed through the original image (which was on a support transparent to the exposing radiation) before striking the photopolymerizable element. The photopolymerizable element was oriented so that the support side was adjacent the element containing the original image. Thus the photopolymerizable stratum was in direct contact with the air so that oxygen was continually replenished during the exposure. The exposure conditions were otherwise the same as described for the reflectographic exposure (using the 7-second exposure time) and preheating and transferring procedure were repeated according to the above description. The copy thus obtained was essentially identical to the copy obtained by the reflectographic exposure.

The present process is useful in a variety of copying, printing, decorative and manufacturing applications. Multicopies of the process images can be obtained from the transferred image. The number of copies prepared is dependent on the photopolymerizable composition thickness as well as the process conditions. The process is also useful for preparing multicolor reproductions. Colorless constituents which form colored compounds when heat is applied or brought into contact with other color forming components are useful in the instant transfer process. Reflex exposures can be used for any of these applications provided the base support is transparent or translucent and is especially useful in copying from poor or non-light transmitting supports, e.g., paper, cardboard, etc.

Lithographic surfaces can be produced by thermally transferring a hydrophobic layer to a hydrophilic receptor surface or vice versa. The images on the lithographic surface can be made impervious to chemical or solvent attack by postexposing the lithographic surface. Alternatively, the exposed areas of the photopolymerizable composition, after the underexposed areas are transferred, can be used as a lithograph-offset printing plate if they are hydrophobic and the original sheet support is hydrophilic or vice versa. Silk screens can also be made by this process.

The transferred images are not only useful for making copies of the original image transparency by dry methods as indicated above; but, after transfer of the unexposed areas to a receptor support, the thermoplastic surface can be treated with e.g., aqueous or organic solvent solutions, dyes, inks, etc. to form colored images. Colored copies of the original image can be obtained when the wet surface is brought into intimate contact with a receptor support and the surfaces separated. Solvents which are used for the spirit copying, e.g., ethanol, water, should meter out the dye used and be a non-solvent for the polymer, i.e., the solubility of the dye and binder are important factors in selecting the solvent. The process is also useful because it permits the rapid examination of the printing qualities, e.g., of separation, negatives and positives, under conditions simulating true printing.

The present process has the advantage that by a simple procedure, involving the use of light and heat in a dry system, copies of images which are of high quality and stability are obtained rapidly. The process is very versatile, i.e., it is useful in copying, e.g., multicopying, printing, silk screen processes and in color reproduction, including multicolor reproduction. Both line and halftone images can be transferred simultaneously.

One of the particularly interesting and advantageous aspects of this invention is that there is broad exposure latitude, i.e., it is unlikely that the photopolymerizable element will suffer from overexposure when, within reasonable limits, one carries out the process of this invention. Practically no difference in the appearance of the finished copy can be detected when exposure times are doubled, quadrupled or extended to even greater magnitudes.

Another very significant advantage of this invention is that it effects a reduction in stain (transfer of materials, especially dyes, from the exposed surface areas of the photopolymerizable stratum), made possible by the preheating step of this invention. This invention also does away with the need of an oxygen barrier (e.g., a vacuum printing frame, a strippable cover sheet, or a thermally transferrable overcoating) which tends to simplify the process. Still further advantages will be apparent to those skilled in the art of image formation.

What is claimed is:

1. In a process for image production which comprises (A) exposing, until polymerization occurs, a photopolymerizable element with actinic radiation, imagewise and under atmospheric conditions, said photopolymerizable element having a support bearing a photopolymerizable stratum which is solid below 40° C. and thermally transferable by having a stick temperature above 40° C. and below 220° C., said stratum comprising (1) an addition polymerizable, non-gaseous, ethylenically unsaturated compound containing at least one terminal ethylenic group, having a boiling point above 100° C. at normal atmospheric pressure and being capable of forming a high polymer by free-radical initiated, chain-propagating addition polymerization, (2) from 0.001 to 10 or more parts per hundred parts by weight of component (1) of a free-radical generating polymerization initiator system activatable by actinic radiation and (B) heating said exposed element to a temperature above said stick temperature and (C) transferring the unexposed polymer to a receptor, the improvement which comprises pre-heating said exposed element to a temperature above 35° C. but below the stick temperature of the underexposed areas, said process being further characterized in that said exposure step (A) must be sufficient that, after said pre-heating step, there must be provided a difference of at least 10° C. in the stick temperatures of said exposed and unexposed areas.

2. A process for image production which comprises (A) exposing, until polymerization occurs, a photopolymerizable element with actinic radiation, imagewise and under atmospheric conditions, and photopolymerizable element having a support bearing a photopolymerizable stratum which is solid below 40° C. and thermally transferable by having a stick temperature above 40° C. and below 220° C., said stratum comprising (1) an addition polymerizable, non-gaseous, ethylenically unsaturated compound containing at least one terminal ethylenic group, having a boiling point above 100° C. at normal atmospheric pressure and being capable of forming a high polymer by free-radical initiated, chain-propagating addition polymerization, (2) from 0.001 to 10 or more parts per hundred parts by weight of component (1) of a free-radical generating polymerization initiator system activatable by actinic radiation, (B) pre-heating said exposed element to a temperature above 35° C. but below the stick temperature of the underexposed areas, (C) heating said exposed element to a temperature intermediate between the stick temperatures of said exposed and unexposed areas and (D) transferring said image corresponding to the unexposed image areas by bringing the surface of the exposed element into operative contact with the surface of an image-receptive support at an operating temperature intermediate between the stick temperatures of said exposed and underexposed image areas, and separating the two surfaces at a temperature intermediate between the two said stick temperatures, said process being further characterized in that said exposure step (A) must be sufficient that, after said pre-heating step (B), there must be provided a difference of at least 10° C. in the stick temperatures of said exposed and unexposed areas.

3. A process as defined in claim 2 where said stratum contains a viscosity modifying agent.

4. A process as defined in claim 2 where said stratum contains a thermal addition polymerization inhibitor in an amount from 0.001 to 5 parts by weight per 100 parts by weight of the other components of the composition.

5. A process as defined in claim 2 where said stratum contains from 0.001 to 3.0 parts by weight per 100 parts of constituent (1) of a sensitometric modifier.

6. A process as defined in claim 2 where said exposing of said photopolymerizable material is by reflex exposure.

7. A process as defined in claim 2 where said initiator is phenanthrenequinone.

8. A process for image production which comprises (A) exposing by reflex exposure, until polymerization occurs, a photopolymerizable element with actinic radiation, imagewise and under atmospheric conditions, said photopolymerizable element having a support bearing a photopolymerizable stratum which is solid below 40° C. and thermally transferable by having a stick temperature above 40° C. and below 220° C., said stratum comprising (1) an addition polymerizable, non-gaseous, ethylenically unsaturated compound containing at least one terminal ethylenic group, having a boiling point above 100° C. at normal atmospheric pressure and being capable of forming a high polymer by free-radical initiated, chain-propagating addition polymerizing, (2) from 0.001 to 10 or more parts per hundred parts by weight of compound (1) of a free-radical generating polymerization initiator system activatable by actinic radiation, and (3) from 0.001 to 3 parts of constituent (1) of a sensitometric modifier, (B) pre-heating said exposed element to a temperature above 35° C. but below the stick temperature of the underexposed areas, (C) heating said exposed element to a temperature intermediate between the stick temperatures of said exposed and unexposed areas and (D) transferring said image corresponding to the unexposed image areas by bringing the surface of the exposed element into operative contact with the surface of an image-receptive support at an operating temperature intermediate between the stick temperatures of said exposed and underexposed image areas and separating the two surfaces at a temperature intermediate between the two said stick temperatures, said process being further characterized in that said exposure step (A) must be sufficient that, after said pre-heating step (B), there must be provided a difference of at least 10° C. in the stick temperatures of said exposed and unexposed areas.

9. A process as defined in claim 8 where said sensitometric modifier is N,N-diethyl-p-nitrosoaniline.

10. A process as defined in claim 8 where said sensitometric modifier is N,N-dimethyl-p-nitrosoaniline.

11. A process as defined in claim 8 wherein said contact time of said transfer is from 0.1 to 10 seconds.

12. A process as defined in claim 8 where said photopolymerizable stratum contains a colorant.

References Cited

UNITED STATES PATENTS

| | | | |
|---|---|---|---|
| 2,475,980 | 7/1949 | Murray | 96—115 X |
| 2,673,151 | 3/1954 | Gerhart | 96—115 X |
| 3,060,023 | 10/1962 | Burg et al. | 96—28 |

NORMAN G. TORCHIN, *Primary Examiner.*

R. H. SMITH, *Assistant Examiner.*